US 6,895,416 B2

(12) United States Patent
Gara et al.

(10) Patent No.: US 6,895,416 B2
(45) Date of Patent: May 17, 2005

(54) CHECKPOINTING FILESYSTEM

(75) Inventors: Alan G. Gara, Mount Kisco, NY (US); Mark E. Giampapa, Irvington, NY (US); Burkhard D. Steinmacher-Burow, Mount Kisco, NY (US)

(73) Assignee: International Business Machines Corporation, Armonk, NY (US)

( * ) Notice: Subject to any disclaimer, the term of this patent is extended or adjusted under 35 U.S.C. 154(b) by 169 days.

(21) Appl. No.: 10/258,515

(22) PCT Filed: Feb. 25, 2002

(86) PCT No.: PCT/US02/05613
§ 371 (c)(1),
(2), (4) Date: Oct. 24, 2002

(87) PCT Pub. No.: WO02/069200
PCT Pub. Date: Sep. 6, 2002

(65) Prior Publication Data
US 2003/0078933 A1 Apr. 24, 2003

Related U.S. Application Data

(60) Provisional application No. 60/271,124, filed on Feb. 24, 2001.
(51) Int. Cl.[7] .............................................. G06F 17/00
(52) U.S. Cl. ..................... 707/204; 707/200; 707/202; 711/141; 711/162
(58) Field of Search ................................ 711/141, 162; 707/8, 200, 201, 202, 204

(56) References Cited

U.S. PATENT DOCUMENTS

| | | | | |
|---|---|---|---|---|
| 5,551,043 A | * | 8/1996 | Crump et al. ............... | 713/323 |
| 5,864,849 A | * | 1/1999 | Bohannon et al. ............ | 707/8 |
| 6,173,292 B1 | * | 1/2001 | Barber et al. ............... | 707/200 |
| 6,385,625 B1 | * | 5/2002 | Slaughter ................... | 707/201 |

* cited by examiner

*Primary Examiner*—Safet Metjahic
*Assistant Examiner*—Haythim Alaubaidi
(74) *Attorney, Agent, or Firm*—Scully, Scott, Murphy & Presser; Daniel P. Morris, Esq.

(57) ABSTRACT

The present in invention is directed to a checkpointing filesystem of a distributed-memory parallel supercomputer comprising a node that accesses user data on the filesystem, the filesystem comprising an interface that is associated with a disk for storing the user data. The checkpointing filesystem provides for taking and checkpoint of the filesystem and rolling back to a previously taken checkpoint, as well as for writing user data to and deleting user data from the checkpointing filesystem. The checkpointing filesystem provides a recently written file allocation table (WFAT) for maintaining information regarding the user data written since a previously taken checkpoint and a recently deleted file allocation table (DFAT) for maintaining information regarding user data deleted from since the previously taken checkpoint, both of which are utilized by the checkpointing filesystem to take a checkpoint of the filesystem and rollback the filesystem to a previously taken checkpoint, as well as to write and delete user data from the checkpointing filesystem.

25 Claims, 7 Drawing Sheets

CHECKPOINTING FILESYSTEM

CROSS REFERENCE

The present invention claims the benefit of commonly-owned, co-pending U.S. Provisional Patent Application Ser. No. 60/271,124 filed Feb. 24, 2001 entitled MASSIVELY PARALLEL SUPERCOMPUTER, the whole contents and disclosure of which is expressly incorporated by reference herein as if fully set forth herein. This patent application is additionally related to the following commonly-owned, co-pending U.S. patent applications filed on even date herewith, the entire contents and disclosure of each of which is expressly incorporated by reference herein as if fully set forth herein. U.S. patent application Ser. No. 10/468,999 filed Aug. 22, 2003 for "Class Networking Routing"; U.S. patent application Ser. No. 10/469,000 filed Aug. 22, 2003, for "A Global Tree Network for Computing Structures"; U.S. patent application Ser. No. 10/468,997 filed Aug. 22, 2003, for 'Global Interrupt and Barrier Networks"; U.S. patent application Ser. No. 10/469,001 filed Aug. 22, 2003, for "Optimized Scalable Network Switch"; U.S. patent application Ser. No. 10/468,991 filed Aug. 22, 2003, for "Arithmetic Functions in Torus and Tree Networks"; U.S. patent application Ser. No. 10/468,992 filed Aug. 22, 2003, for 'Data Capture Technique for High Speed Signaling"; U.S. patent application Ser. No. 10/468,995 filed Aug. 22, 2003, for 'Managing Coherence Via Put/Get Windows'; U.S. patent application Ser. No. 10/468,994 filed Aug. 22, 2003, for "Low Latency Memory Access And Synchronization"; U.S. patent application Ser. No. 10/468,990 filed Aug. 22, 2003, for 'Twin-Tailed Fail-Over for Fileservers Maintaining Full Performance in the Presence of Failure'; U.S. patent application Ser. No. 10/468,996 filed Aug. 22, 2003, for "Fault Isolation Through No-Overhead Link Level Checksums'; U.S. patent application Ser. No. 10/469,003 filed Aug. 22, 2003, for "Ethernet Addressing Via Physical Location for Massively Parallel Systems"; U.S. patent application Ser. No. 10/469,002 filed Aug. 22, 2003, for "Fault Tolerance in a Supercomputer Through Dynamic Repartitioning"; 10/258,515 filed Oct. 24, 2003 for "Checkpointing Filesystem"; U.S. patent application Ser. No. 10/468,998 filed Aug. 22, 2003, for "Efficient Implementation of Multidimensional Fast Fourier Transform on a Distributed-Memory Parallel Multi-Node Computer"; U.S. patent application Ser. No. 10/468,993 filed Aug. 22, 2003, for "A Novel Massively Parallel Supercomputer"; and U.S. Pat. No. 6,592,449 issued Jul. 15, 2003, for "Smart Fan Modules and System".

BACKGROUND OF THE INVENTION

1. Technical Field of the Invention

The present invention generally relates to a field of filesystems in computers. More particularly, the present invention is directed to efficiently checkpointing a filesystem on a distributed-memory parallel supercomputer, thereby facilitating faster execution of applications.

2. Description of the Prior Art

In large computing systems, such as a distributed-memory parallel supercomputer, it is standard to save a state of a system at regular intervals such that a application can be rolled back and rerun from a last saved state of the system, thereby saving time and computing resources. This is necessary because the large computing systems do not have the reliability of small computing systems and the applications that utilize the large computing systems often run for hours, days or weeks. More particularly, the large computing systems may crash or be brought down for maintenance, exceptions may be encountered while an application executes, or programmer-defined conditions may be met which terminate the application. Since the application manipulates disk files, the roll back restores the manipulated disk files to a previous clean state, i.e., to a previous checkpoint. Therefore, checkpointing the application mitigates the rerunning of the application since the application need only be rolled back to the previous checkpoint rather than be rerun from the start. Thus, checkpointing of the filesystem is a critical aspect of checkpointing in the large computing systems, such as the distributed-memory parallel supercomputer.

A main motivation for a distributed-memory parallel supercomputer is a fast execution of the application. Thus, during the execution of an application on the distributed-memory parallel supercomputer, there is a need for a checkpointing filesystem, which is not significantly slower than a filesystem without checkpointing. Similarly, there is a need for a checkpointing filesystem in which the act of checkpointing is fast, since during checkpointing of the filesystem the application is not executing. There also is a need for a checkpointing filesystem, which appears to the application as a normal filesystem and does not complicate the implementation of the application.

Therefore, there is a need in the art for providing a checkpointing filesystem on the distributed-memory parallel supercomputer that facilitates faster execution of an application executing on the distributed-memory parallel supercomputer.

SUMMARY OF THE INVENTION

It is therefore an object of the present invention to provide a checkpointing filesystem that facilitates fast execution of an application on the distributed-memory parallel supercomputer.

It is another object of the present invention to provide a checkpointing filesystem, which is not significantly slower than a filesystem without checkpointing on the distributed-memory parallel supercomputer.

It is a yet another object of the present invention to provide a checkpointing filesystem, which appears to the application as a conventional filesystem and does significantly effect an application on the distributed-memory parallel supercomputer.

It is a further object of the present invention to provide a checkpointing filesystem in which the taking of a checkpoint does not significantly effect execution of an application on the distributed-memory parallel supercomputer.

It is yet a further object of the present invention to provide a checkpointing filesystem in which the rolling back of a previously taken checkpoint is efficient as possible, thereby not significantly effecting the application on the on the distributed-memory parallel supercomputer.

According to an embodiment of the present invention, there is provided a method for checkpointing a filesystem of a distributed-memory parallel supercomputer comprising a node that accesses user data on the filesystem, the filesystem comprising an interface that is associated with a disk for storing the user data, the method comprising the steps of: informing the node and the interface to complete their access to the filesystem in order to take a checkpoint of the filesystem; directing the interface to take the checkpoint of the associated disk, the taking of the checkpoint comprising a step of clearing: (i) a recently written file allocation table (WFAT) for maintaining information regarding the user data written to the disk since a previously taken checkpoint; (ii) a recently deleted file allocation table (DFAT) for maintaining information regarding the user data deleted from the disk since the previously taken checkpoint; and informing the node and the interface that they may resume their access to the filesystem, wherein the WFAT and DFAT are utilized to rollback the filesystem to a clean state.

According to another embodiment of the present invention, there is provided a method for rolling back a checkpointing filesystem of a distributed-memory parallel supercomputer comprising a node that accesses user data on the filesystem to a previously taken checkpoint of the filesystem, the filesystem comprising an interface that is associated with a disk for storing the user data, the method comprising the steps of: informing the node and the interface to complete their access to the filesystem in order rollback to the previously taken checkpoint of the filesystem; directing the interface to rollback to the previously taken checkpoint of the associated disk, the rolling back to the previously taken checkpoint comprising:

(i) removing user data from a file allocation table (FAT) utilizing a recently written file allocation table (WFAT) that maintains information regarding the user data written to the disk since the previously taken checkpoint; (ii) adding user data to the FAT from a recently deleted file allocation table (DFAT) that maintains information regarding user data deleted from the disk since the previously taken checkpoint; and informing the node and the interface that they may resume their access to the filesystem, wherein the WFAT and DFAT are utilized to rollback the filesystem to a clean state.

According to yet another embodiment of the present invention, there is provided a method for writing user data to a checkpointing filesystem of a distributed-memory parallel supercomputer comprising a node that accesses the user data on the filesystem, the filesystem comprising an interface that is associated with a disk for storing the user data, the method comprising the steps of: selecting sectors that are marked as free in a file allocation table (FAT) and not marked as deleted in a recently deleted file allocation table (DFAT) that maintains information regarding user data deleted from the disk since a previously taken checkpoint; writing the user data to the selected sectors on the disk; updating the FAT to reflect the written user data; and updating a recently written file allocation table (WFAT) that maintains information regarding the user data written to the disk since the previously taken checkpoint, wherein the WFAT and DFAT are utilized to rollback the filesystem to a clean state.

According to a further embodiment of the present invention, there is provided a method for deleting user data from a checkpointing filesystem of a distributed-memory parallel supercomputer comprising a node that accesses the user data on the filesystem, the filesystem comprising an interface that is associated with a disk for storing the user data, the method comprising the steps of: deleting sectors associated with the user data to be deleted from the disk from a file allocation table (FAT); determining whether the sectors to be deleted are marked in a recently written file allocation table (WFAT) that maintains information regarding user data written to the disk since a previously taken checkpoint; and updating a recently deleted file allocation table (DFAT) if the sectors are not marked in WFAT at step (b), the DFAT maintaining information regarding the user data deleted from the disk since the previously taken checkpoint, wherein the WFAT and DFAT are utilized to rollback the filesystem to a clean state.

According to yet a further embodiment, there is provided a checkpointing filesystem of a distributed-memory parallel supercomputer comprising a node that accesses user data on the filesystem, the filesystem comprising an interface that is associated with a disk for storing the user data, comprising: a host controller comprising means for informing the node and the interface to complete their access to the filesystem in order to take a checkpoint of the filesystem, directing the interface to take a checkpoint of the associated disk, and informing the node and the interface that they may resume their access to the filesystem after the checkpoint it taken; and the interface comprising a means for clearing: a recently written file allocation table (WFAT) that maintains information regarding the user data written to the disk since a previously taken checkpoint; and a recently deleted file allocation table (DFAT) for maintaining information regarding the user data deleted from the disk since the previously taken checkpoint, wherein the WFAT and DFAT are utilized to rollback the filesystem to a clean state.

The checkpointing filesystem of the distributed-memory parallel supercomputer further comprises rolling back to the previously taken checkpoint, wherein: the host controller further comprises means for informing the node and the interface to complete their access to the filesystem in order rollback to the previously taken checkpoint of the filesystem, for directing the interface to rollback to the previously taken checkpoint of the associated disk, and for informing the node and the interface that they may resume their access to the filesystem; and the interface further comprises means for rolling back to the previously taken checkpoint, the means comprising removing user data from a file allocation table (FAT) utilizing the WFAT and adding user data to the FAT from DFAT.

The checkpointing filesystem of the distributed-memory parallel supercomputer further comprising writing user data to the checkpointing filesystem, wherein: the interface further comprises means for selecting sectors that are marked as free in the FAT and not marked for deletion in DFAT, for writing the user data to the selected sectors on the disk; for updating the FAT to reflect the written user data, and for updating WFAT.

The checkpointing filesystem of a distributed-memory parallel supercomputer further comprising deleting user data from the checkpointing filesystem, wherein: the interface further comprises means for deleting sectors associated with the user data to be deleted from the disk from the FAT, for determining whether the sectors to be deleted are marked in the WFAT, and for updating the DFAT if the sectors are not marked in WFAT.

BRIEF DESCRIPTION OF THE DRAWINGS

The objects, features and advantages of the present invention will become apparent to one skilled in the art, in view of the following detailed description taken in combination with the attached drawings, in which.

DETAILED DESCRIPTION OF THE PREFERRED EMBODIMENT OF THE INVENTION

The present invention is directed a checkpointing filesystem on the distributed-memory parallel supercomputer that facilitates faster execution of an application executing on the distributed-memory parallel supercomputer.

Figure 1:
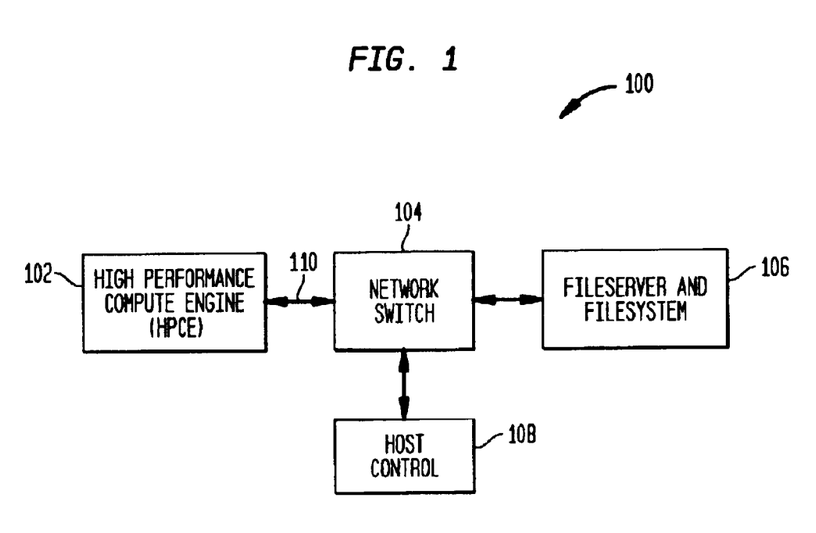
FIG. 1 illustrates an exemplary high-level system diagram for performing checkpointing of the filesystem according to the present invention.

FIG. 1 is an exemplary high-level system diagram 100 for performing checkpointing of the filesystem according to the present invention. The high performance computer engine (i.e., "HPCE") 102 represents the distributed-memory parallel supercomputer. The HPCE is a distributed-memory parallel supercomputer that comprises a plurality of nodes. The HPCE 102 communicates via the network switch 104 with the fileserver/filesystem 106 and host control server 108. The HPCE communicates with the foregoing system components over communication connections 110, which may represent standard networking connections, such as Ethernet and the like. The host control server 108 controls the HPCE 102 and the fileserver/filesystem 106, and determines when to perform a checkpoint of the filesystem and when to restore the filesystem from a previous checkpoint as will be described below in greater detail.

Figure 2:
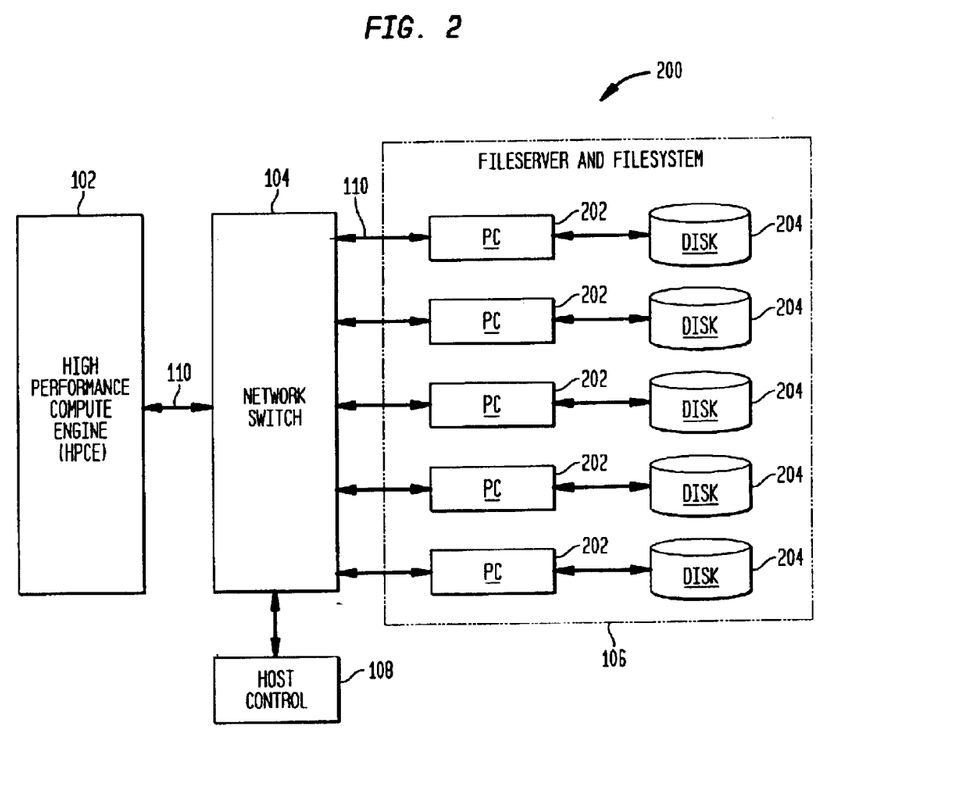
FIG. 2 illustrates is an exemplary more-detailed system diagram of FIG. 1 for performing checkpointing of the filesystem according to the present invention.

FIG. 2 is an exemplary more-detailed system diagram 200 of FIG. 1 for performing checkpointing of the filesystem according to the present invention. The fileserver/filesystem 106 comprises a plurality of personal computers (i.e., "PCs") 202. The distributed-memory parallel supercomputer comprises approximately 1024 PCs. In the distributed-memory parallel supercomputer, each PC 202 serves a Redundant Array of Independent Disks (i.e., "RAID") cage, i.e., a plurality of disk drives. For brevity and clarity of the present invention, the following description will be in terms of each PC 202 serving a disk 204 instead of a RAID cage. More particularly, each PC 202 serves as an interface for the HPCE 102 to an associated disk 204 via the network switch 104. The HPCE 102 communicates with the fileserver/filesystem 106 via messages that represent basic file operations, such as read, write and delete. A node of the HPCE 102 may access any file stored on any disk 204 via associated PC interface 202.

Further with reference to FIG. 2, in order to perform a checkpoint, the host control 108 informs each of the nodes of the HPCE 102 and the PCs 202 to complete any disk activity (i.e., access) and not to start any new disk activity. The host control 108 directs each PC 202 to make a checkpoint of its associated disk 204. This checkpointing activity is completely local to each PC 202 and its associated disk 204. The checkpointing activity is the same with regard to all PCs, i.e., as if a single PC 202 performs a checkpoint of its associated disk 204. Similarly, when a checkpoint is restored, the restoration is completely local to each PC 202 and its associated disk 204. Therefore, in the following description performing a checkpoint and restoring a checkpoint will be described in detail with regard to a single PC 202 and associated drive 204. The host control 108 is a complete computer including its own internal filesystem, which maintains the software for driving the host control 108, including the taking of a checkpoint and rolling back to previous checkpoint as described below in greater detail. In fileserver/filesystem 106, each PC 202 is a complete computer including its own internal filesystem, in addition to the associated disk 204. The internal filesystem of the PC 202 maintains the software for driving the PC 202, including the taking of a checkpoint and rolling back to a previous checkpoint as described below in greater detail.

Figure 3:
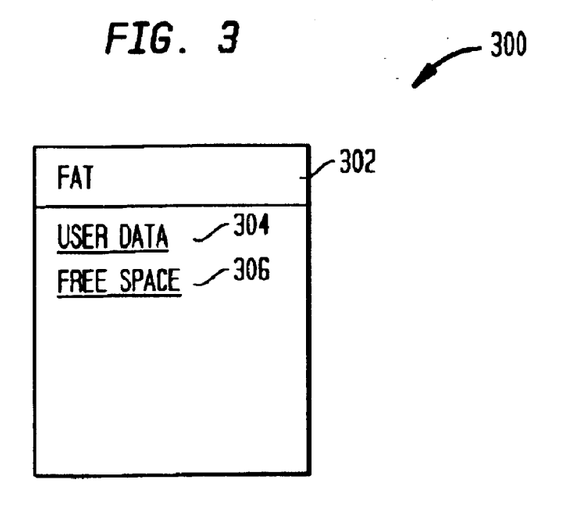
FIG. 3 illustrates a conventional filesystem without checkpointing.

FIG. 3 depicts a conventional filesystem 300 without checkpointing. The filesystem 300 occupies an entire disk or a portion of the disk. The filesystem comprises two parts. The first part is user data 304 and the free space 306 in the filesystem. The second part is a File Allocation Table (i.e., "FAT"), also known as metadata, which includes a description of the user data 304 and the free space 306. Thus, the FAT 302 includes filenames, file data start sectors, file sizes, as well as free sectors. An example of such a FAT 302 is the industry standard FAT32.

Figure 4:
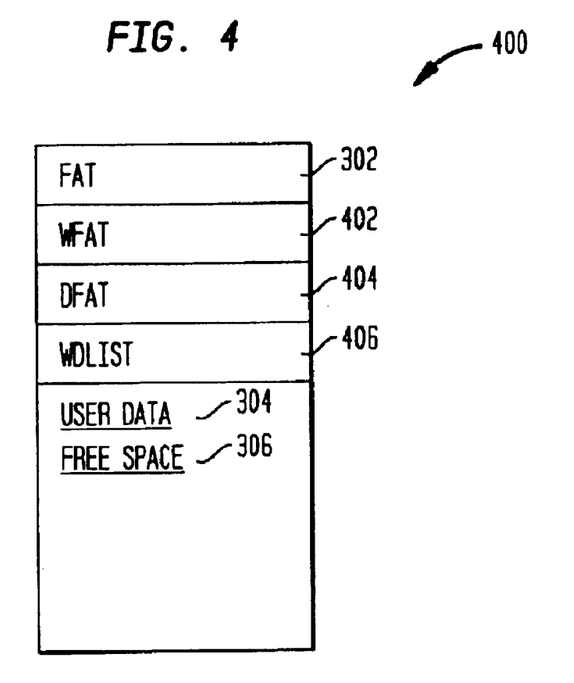
FIG. 4 illustrates an exemplary checkpointing filesystem according to the present invention.

FIG. 4 is an exemplary checkpointing filesystem 400 according to the present invention. The filesystem comprises five parts. The first part is the user data 304 and the free space 306 in the checkpointing filesystem 400, which are analogous to the filesystem without checkpointing 300 in FIG. 3. The second part is the File Allocation Table (i.e., "FAT") 302, which is analogous to that of the filesystem without checkpointing 300 in FIG. 3. The third part of the checkpointing filesystem 400 is a recently Written FAT (i.e., "WFAT") 402, which is structured like the FAT 302, but only maintains information on the user data 304 written since a previous checkpoint. The fourth part of the checkpointing filesystem 400 is a recently Deleted FAT (i.e., "DFAT") 404, which is structured like the FAT 302, but only maintains information on the user data 304 deleted since the previous checkpoint. The fifth and final part the checkpointing filesystem 400 is the recently Written or Deleted list (i.e., "WDLIST") of user data, which includes the same information as the WFAT 402 and the DFAT 404. The WFAT 402 and DFAT 404 are optimal for fast random access, since they provide indexed by sector access to information about recently written or deleted user data 304. Like the FAT 302, the WFAT 402 includes an entry for every sector in the checkpointing filesystem 400. Typically only a small fraction, if any, of sectors includes user data 304 written since the previous checkpoint, so most of the WFAT 402 entries are empty. Similarly, most of the DFAT 404 entries are empty. By contrast to the WFAT 402 and DFAT 404, the WDLIST 406 is optimal for fast sequential access to all the information about the recently written or deleted user data 304. More particularly, the WDLIST 406 provides a list of sectors in the WFAT 402 marking data written since the previous checkpoint and of sectors in the DFAT 404 marking data deleted since the previous checkpoint.

Figure 5:
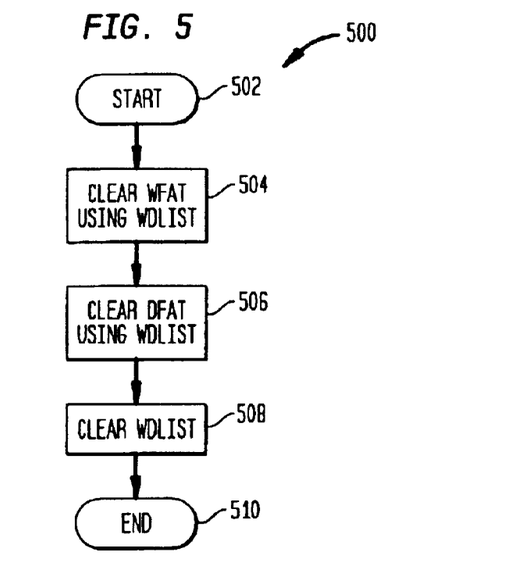
FIG. 5 illustrates an exemplary method flowchart that depicts taking a checkpoint in the checkpointing filesystem of FIG. 4 according to the present invention.

FIG. 5 is an exemplary method flowchart 500 that depicts taking a checkpoint in the checkpointing filesystem 400 according to the present invention. The taking of the checkpoint starts at step 502. At step 504, the WFAT 402 is cleared, since at the checkpoint the user data 304 written since a previous checkpoint becomes part of the checkpoint. Since the WFAT 402, just like the FAT 302, is a large data structure, clearing the WFAT 402 by iterating through the entire data structure is inefficient. Because the WDLIST 406 is a much smaller data structure than the WFAT 402, it is faster to clear the WFAT 402 using entries in the WDLIST 406. At step 506, the DFAT 404 is cleared since at the checkpoint the user data 304 deleted since the previous checkpoint must be deleted from the checkpoint. For efficiency, the DFAT 404 is cleared using WDLIST 406. More particularly, the WDLIST 406 is a list of all sectors in the WFAT 402 and DFAT 404 marking user data 304 written or deleted since the previous checkpoint. The WFAT 404 and DFAT 404 are cleared by unmarking each sector listed in the WDLIST 406. After the WFAT 402 and the DFAT 404 are respectively cleared at steps 504 and 506, the WDLIST 406 is also cleared by deleting its list of marked sectors. At this point the filesystem is in a clean or consistent state. The exemplary taking of the checkpoint 500 is fast as required by the distributed-memory parallel supercomputer illustrated in FIGS. 1 and 2, and minimally impacts the application.

Figure 6:
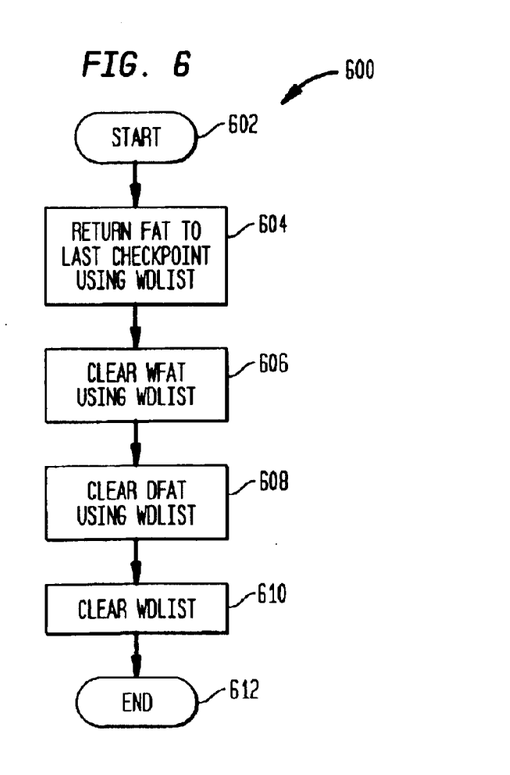
FIG. 6 illustrates an exemplary method flowchart that depicts rolling back to a previously taken checkpoint in the checkpointing filesystem of FIG. 4 according to the present invention.

FIG. 6 is an exemplary method flowchart 600 that depicts rolling back to a previously taken checkpoint according to the present invention. The rolling back to the previously taken checkpoint starts at step 602. At step 604, the FAT 302 is returned to the previously taken checkpoint using WDLIST 406. More particularly, at the rollback to the previously taken checkpoint, the user data 304 written since the previous checkpoint is removed from the FAT 302, and the user data 304 deleted since the previous checkpoint is returned to the FAT 302. Since the WDLIST 406 includes all the information on the user data 304 written and deleted since the previously taken checkpoint, the WDLIST is used to return the FAT to the previously taken checkpoint. At step 606, the WFAT 402 is cleared utilizing WDLIST 406 for efficiency. Since, the WDLIST 406 is a list of all sectors in the WFAT 402 and DFAT 404 marking user data 304 written or deleted since the previous checkpoint, the WFAT 402 and DFAT 404 are cleared by unmarking each sector listed in the WDLIST 406. At step 608, the DFAT 404 is cleared utilizing the WDLIST 406. At step 610, the WDLIST 406 is then cleared. The situation immediately after the rollback of the FAT is the same as after taking a checkpoint in FIG. 5 above, i.e., the filesystem is in a clean or consistent state. Therefore, the application may resume execution from the rolled back checkpoint without restarting the application.

Figure 7:
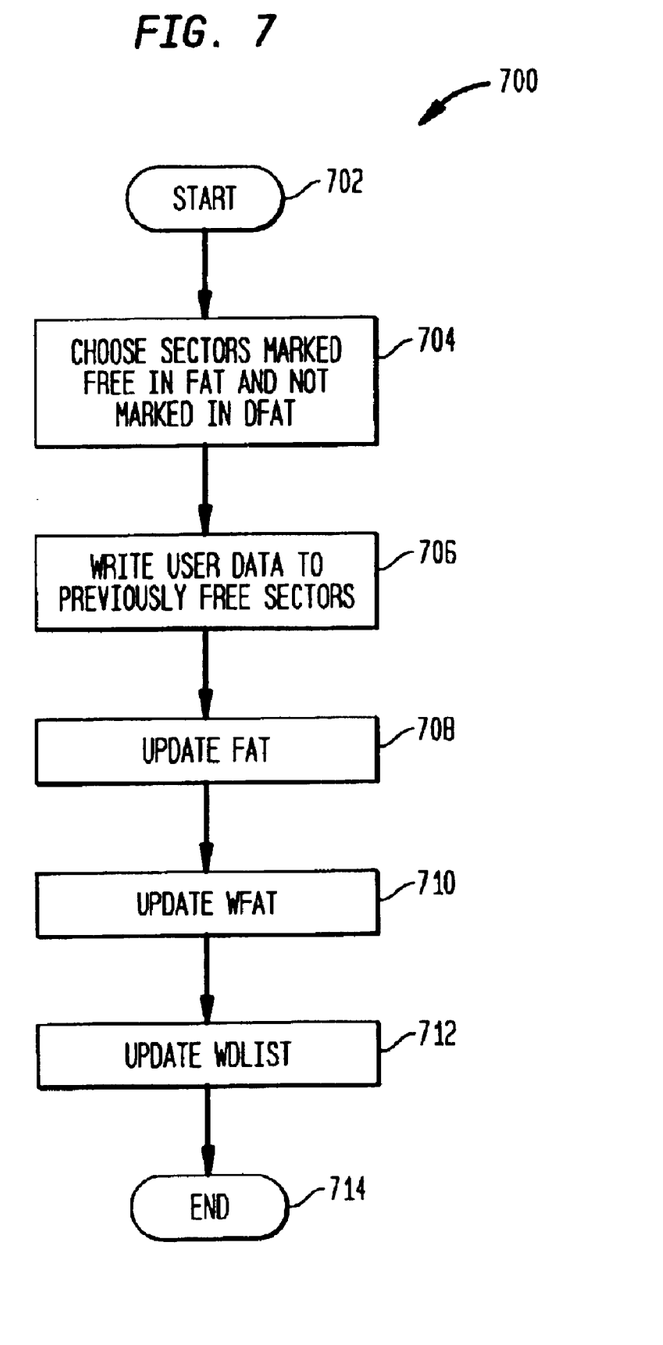
FIG. 7 illustrates an exemplary method flowchart that depicts writing of user data to the checkpointing filesystem 400 of FIG. 4 according to the present invention.

FIG. 7 is an exemplary method flowchart 700 that depicts a write of user data 304 to the checkpointing filesystem 400 of FIG. 4 according to the present invention. It is to be noted that the steps of FIG. 7 described below are behind the scenes and are not visible to the application. The writing of the user data 304 to the checkpointing filesystem 400 starts at step 702. At step 704, sectors marked as free in the FAT 302 and not marked for deletion in the DFAT 404 are chosen for the write. More particularly, as in the case of the filesystem without checkpointing 300 of FIG. 3, free sectors to contain the user data 304 that is to be written have to be found first, except that in the checkpointing filesystem 400 the sectors cannot be marked as deleted in the DFAT 404 because they are sectors marked as deleted since the previously taken checkpoint and must be preserved in case of a rollback to the previously taken checkpoint. Given that the free sectors are not in the DFAT 402, the user data 304 may be written to the free sectors at step 706. At step 708, the FAT 302 is updated to reflect the write of user data 304. Since the write is after a previous checkpoint, WFAT 402 and WDLIST 406 are respectively updated at steps 710 and 712. At step 714, the writing of user data 304 to the checkpointing filesystem 400 ends. In the conventional filesystem 300 without checkpointing, the filesystem 300 also performs a set of steps for writing the user data to the filesystem 300.

The conventional steps include: choosing sectors marked free in the FAT 302; writing the user data 304 to the free sectors; and updating the FAT to reflect the user data written. Over and above the conventional filesystem 300, the following steps are additional due to the checkpointing of the filesystem according to the present invention: ensuring that the free sectors are not in DFAT 404; updating WFAT 402 and updating WDLIST 406 as particularly described above. The additional steps take little time as compared to the writing the user data 304. For example, ensuring that the sectors are not in DFAT is a fast random access lookup. Thus the checkpointing filesystem 400 of FIG. 4 according to the present invention is almost as fast as the filesystem without checkpointing 300 of FIG. 3. This fact satisfies the speed required by the distributed-memory parallel supercomputer illustrated in FIGS. 1 and 2.

Figure 8:
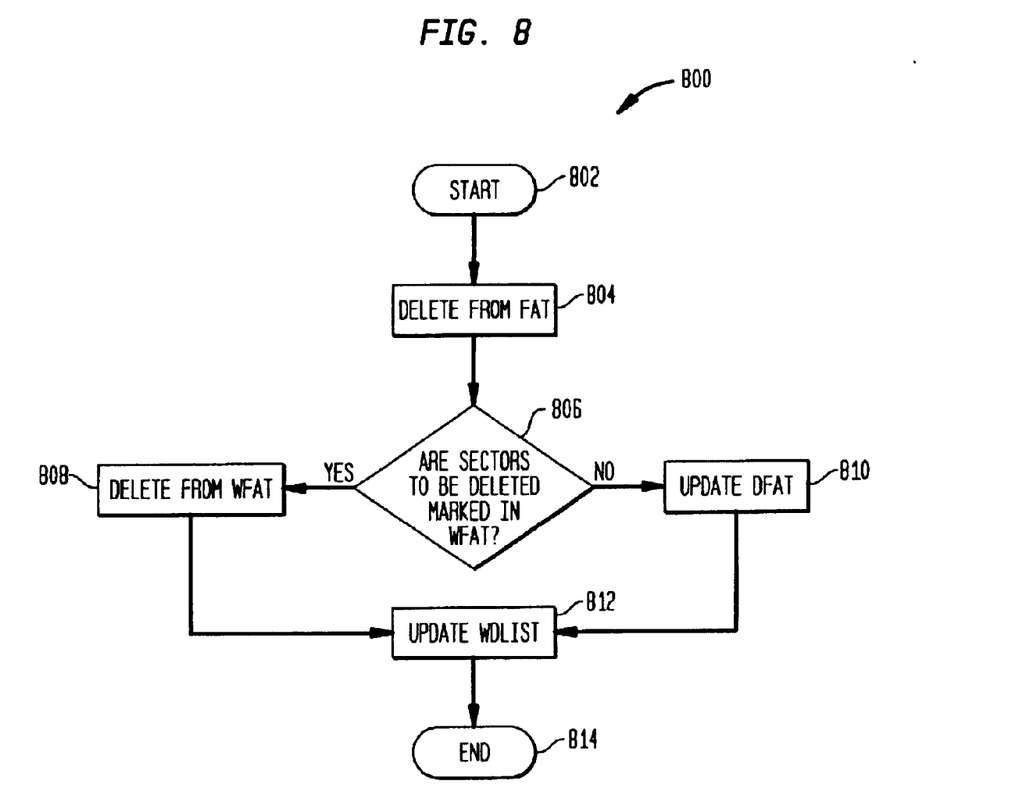
FIG. 8 illustrates an exemplary method flowchart that depicts deleting of user data from the checkpointing filesystem 400 according to the present invention.

FIG. 8 is an exemplary method flowchart 800 describing how a delete of user data 304 from the checkpointing filesystem 400 according to the present invention. The deleting of the user data 304 from the checkpointing filesystem 400 starts at step 802. It is to be noted that the steps of FIG. 8 described below are behind the scenes and are not visible to the application. At step 804, sectors associated with user data 304 to be deleted are deleted from the FAT 302. At step 806, it is determined whether the sectors to be deleted from the FAT 302 are marked in the WFAT 402. If the sectors to be deleted are marked in the WFAT 402, then the sectors are deleted from the WFAT 402 at step 808. Otherwise, if the sectors to be deleted are not marked in the WFAT 402, the DFAT 404 is updated at step 810 by marking in the DFAT 404 the deleted sectors. More particularly with regard to steps 806 and 808, if the sectors to be deleted are marked in the WFAT 402, then the entries are unmarked in the WFAT 402 and the DFAT 404 is not updated since the sectors deleted were created after the previous checkpoint and thus should not be recovered in a rollback. With regard to steps 806 and 810, the sectors to be deleted are not marked in the WFAT 402, and thus the sectors were created before the previous checkpoint and thus should be recovered in a rollback. Therefore, the sectors are marked in the DFAT 404. In either case, whether or not the sectors to be deleted are marked in the WFAT 402, the WDLIST 406 is updated at step 812 with the sectors unmarked in the WFAT 402 or marked in the DFAT 404. At step 814, the deleting of the user data from the checkpointing filesystem 400 ends. In the conventional filesystem 300 without checkpointing, the filesystem 300 also updates the FAT 302 with information concerning the delete. However, the remaining steps of FIG. 8 are unique to the checkpointing filesystem 400 according to the present invention. Since the remaining steps take time that is comparable to updating the FAT 302, the checkpointing filesystem according to the present invention is fast.

Figure 9:
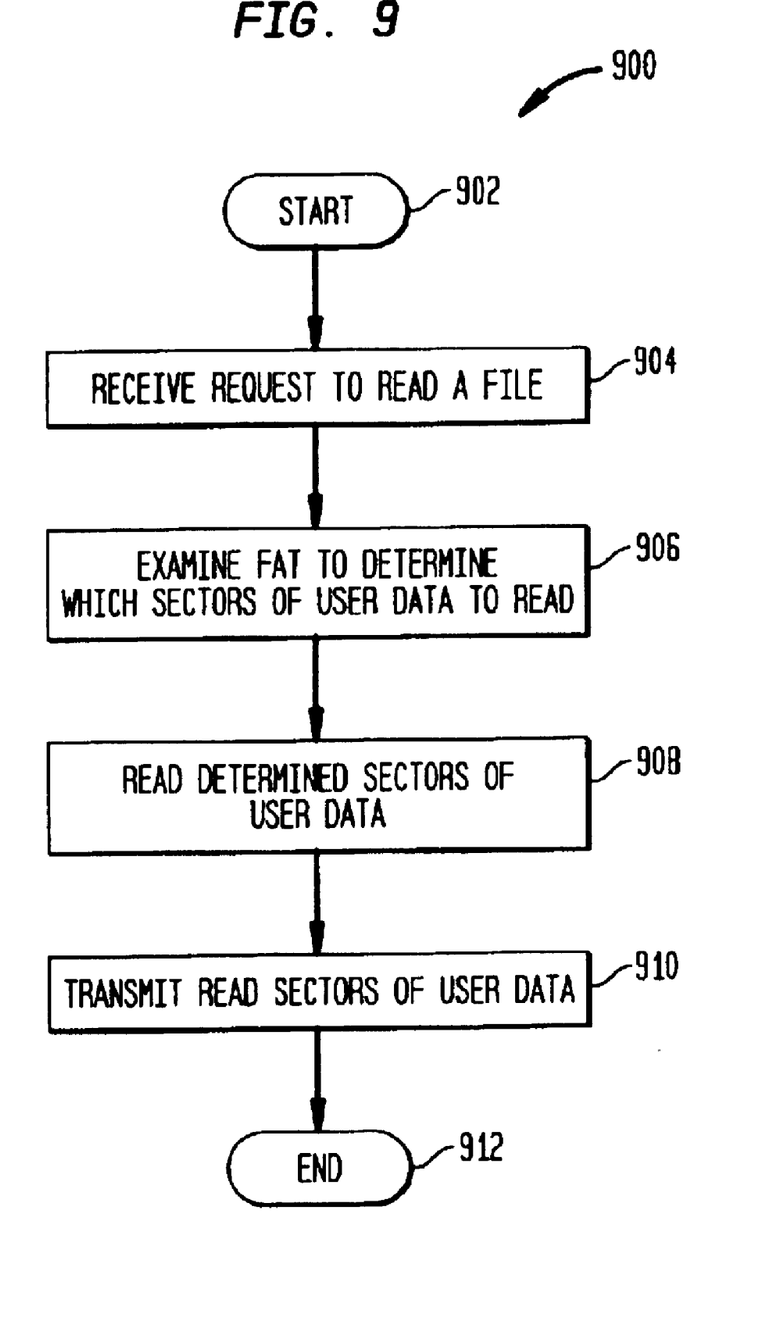
FIG. 9 illustrates an exemplary flowchart that depicts reading of user data in the checkpointing filesystem 400 according to the present invention.

FIG. 9 is an exemplary flowchart 900 that depicts how a read of user data 304 in the checkpointing filesystem 400 according to the present invention. The reading of the user data 304 from the checkpointing filesystem 400 starts at step 902. At step 904, the PC 202 receives a request from a node of the distributed-memory parallel supercomputer to read a file. At step 906, the FAT 302 is examined to determine which sectors to read. At step 908, the PC 202 reads the sectors determined at step 906 from the associated disk 204. At step 910, PC 202 transmits the read sectors to the requesting node of the distributed-memory parallel supercomputer. At step 912, the reading of the user data 304 from the checkpointing filesystem 400 ends. Thus, the reading of user data 304 from the checkpointing filesystem is exactly as it is in a filesystem without checkpointing 300 of FIG. 3.

More particularly, the reads in the checkpointing filesystem 400 of distributed-memory parallel supercomputer illustrated in FIGS. 1 and 2 are as fast as the on the supercomputer with a filesystem without checkpointing 300.

While the invention has been particularly shown and described with regard to preferred embodiments thereof, it will be understood by those skilled in the art that the foregoing and other changes in form and details may be made therein without departing from the spirit and scope of the invention.

What is claimed is:

1. A method for checkpointing a filesystem of a distributed-memory parallel supercomputer comprising a node that accesses user data on the filesystem, the filesystem comprising an interface that is associated with a disk for storing the user data, the method comprising the steps of:
   (a) informing the node and the interface to pause new file operations and complete outstanding file operations on the filesystem in order to take a checkpoint of the filesystem;
   (b) directing the interface to take the checkpoint of the associated disk;
   (c) the taking of the checkpoint comprising a step of clearing:
      (i) a recently written file allocation table (WFAT) for maintaining information regarding the user data written to the disk since the previously taken checkpoint;
      (ii) a recently deleted file allocation table (DFAT) for maintaining information regarding the user data deleted from the disk since the previously taken checkpoint;
   (d) informing the node and the interface that they may resume new file operations on the filesystem; and
   (e) within actions on the filesystem, recording in the WFAT and DFAT information required to rollback the filesystem to the previously taken checkpoint;

2. The method for checkpointing a filesystem of a distributed-memory parallel supercomputer according to claim 1, wherein the WFAT and the DFAT are accessible in random order.

3. The method for checkpointing a filesystem of a distributed-memory parallel supercomputer according to claim 1, wherein a written or deleted list (WDLIST) is provided for maintaining information associated with the WFAT and the DFAT and is accessible in a sequential order.

4. The method for checkpointing a filesystem of a distributed-memory parallel supercomputer according to according to claim 3, wherein the step of clearing utilizes the information of the WDLIST to clear the WFAT and DFAT.

5. The method for checkpointing a filesystem of a distributed-memory parallel supercomputer according to according to claim 4, wherein the method further comprises a step of clearing the WDLIST.

6. The method for rolling back a checkpointing filesystem of a distributed-memory parallel supercomputer according to claim 1, wherein a written or deleted list (WDLIST) is provided for maintaining information associated with the WFAT and the DFAT and is accessible in a sequential order.

7. The method for checkpointing a filesystem of a distributed-memory parallel supercomputer according to claim 1, further including the steps of repeating steps a)–e) for each next checkpoint taken.

8. A method for rolling back a checkpointing filesystem of a distributed-memory parallel supercomputer comprising a node that accesses user data on the filesystem to a previously taken checkpoint of the filesystem, the filesystem comprising an interface that is associated with a disk for storing the user data, the method comprising the steps of:
   (a) informing the node and the interface to pause new file operations and complete outstanding file operations on the filesystem in order rollback to the previously taken checkpoint of the filesystem;
   (b) directing the interface to rollback to the previously taken checkpoint of the associated disk, the rolling back to the previously taken checkpoint comprising:
      (i) removing user data from a file allocation table (FAT) utilizing a recently written file allocation table (WFAT) that maintains information regarding the user data written to the disk since the previously taken checkpoint;
      (ii) adding user data to the FAT from a recently deleted file allocation table (DFAT) that maintains information regarding user data deleted from the disk since the previously taken checkpoint; and
   (c) informing the node and the interface that they may resume new file operations on the filesystem; and
   (d) within actions on the filesystem, recording in the WFAT and DFAT information required to rollback the filesystem to the previously taken checkpoint.

9. The method for rolling back a checkpointing filesystem of a distributed-memory parallel supercomputer according to claim 8, wherein the WFAT and the DFAT are accessible in random order.

10. The method for rolling back a checkpointing filesystem of a distributed-memory parallel supercomputer according to claim 6, wherein the steps of removing and adding user data utilize the information of the WDLIST.

11. The method for rolling back a checkpointing filesystem of a distributed-memory parallel supercomputer according to claim 10, wherein the method further comprises the steps of:
   clearing the WFAT and the DFAT utilizing information of the WDLIST; and
   clearing the WDLIST.

12. The method for rolling back a checkpointing filesystem of a distrubuted-memory parallel supercomputer according to claim 8, further including the steps of repeating steps a)–d) for each next checkpoint taken.

13. A method for writing user data to a checkpointing filesystem of a distributed-memory parallel supercomputer comprising a node that accesses the user data on the filesystem, the filesystem comprising an interface that is associated with a disk for storing the user data, the method comprising the steps of:
   (a) selecting sectors that are marked as free in a file allocation table (FAT) and not marked as deleted in a recently deleted file allocation table (DFAT) that maintains information regarding user data deleted from the disk since a previously taken checkpoint;
   (b) writing the user data to the selected sectors on the disk
   (c) updating the FAT to reflect the written user data; and
   (d) updating a recently written file allocation table (WFAT) that maintains information regarding the user data written to the disk since the previously taken checkpoint; wherein the WFAT and DFAT are utilized to rollback the filesystem to the previously taken checkpoint.

14. The method for writing user data to a checkpointing filesystem of a distributed-memory parallel supercomputer according to claim 13, wherein the WFAT and the DFAT are accessible in random order.

15. The method for writing user data to a checkpointing filesystem of a distributed-memory parallel supercomputer claim 13, wherein a written or deleted list (WDLIST) is provided for maintaining information associated with the WFAT and the DFAT and is accessible in a sequential order.

16. A method for deleting user data from a checkpointing filesystem of a distributed-memory parallel supercomputer comprising a node that accesses the user data on the filesystem, the filesystem comprising an interface that is associated with a disk for storing the user data, the method comprising the steps of:
  (a) deleting sectors associated with the user data to be deleted from the disk from a file allocation table (FAT);
  (b) determining whether the sectors to be deleted are marked in a recently written file allocation table (WFAT) that maintains information regarding user data written to the disk since a previously taken checkpoint; and
  (c) updating a recently deleted file allocation table (DFAT) if the sectors are not marked in WFAT at step (b), the DFAT maintaining information regarding the user data deleted from the disk since the previously taken checkpoint, wherein the WFAT and DFAT are utilized to rollback the filesystem to the previously taken checkpoint.

17. The method for deleting user data from a checkpointing filesystem of a distributed-memory parallel supercomputer according to claim 16, wherein the WFAT and the DFAT are accessible in random order.

18. The method for deleting user data from a checkpointing filesystem of a distributed-memory parallel supercomputer according to claim 16, wherein a written or deleted list (WDLIST) is provided for maintaining information associated with the WFAT and the DFAT and is accessible in a sequential order.

19. The method for deleting user data from a checkpointing filesystem of a distributed-memory parallel supercomputer according to claim 18, further comprising a step of updating the WDLIST.

20. A checkpointing filesystem of a distributed-memory parallel supercomputer comprising a node that accesses user data on the filesystem, the filesystem comprising an interface that is associated with a disk for storing the user data, comprising:
  a host controller comprising means for informing the node and the interface to pause new file operations and complete outstanding file operations on the filesystem in order to take a checkpoint of the filesystem, directing the interface to take a checkpoint of the associated disk, and informing the node and the interface that they may resume new file operations on the filesystem after the checkpoint it taken; and
  the interface comprising a means for clearing: a recently written file allocation table (WFAT) that maintains information regarding the user data written to the disk since a previously taken checkpoint; and a recently deleted file allocation table (DFAT) for maintaining information regarding the user data deleted from the disk since the previously taken checkpoint, wherein the information required to rollback the filesystem to the previous checkpoint is recorded in the WFAT and DFAT.

21. The checkpointing filesystem of a distributed-memory parallel supercomputer according to claim 20, further comprising rolling back to the previously taken checkpoint, wherein:
  the host controller further comprising means for informing the node and the interface to pause new file operations and complete outstanding file operations on the filesystem in order rollback to the previously taken checkpoint of the filesystem, for directing the interface to rollback to the previously taken checkpoint of the associated disk, and for informing the node and the interface that they may resume new file operations on the filesystem; and
  the interface further comprising means for rolling back to the previously taken checkpoint, the means comprising: removing user data from a file allocation table (FAT) utilizing the WFAT and adding user data to the FAT from DFAT.

22. The checkpointing filesystem of a distributed-memory parallel supercomputer according to claim 20, further comprising writing user data to the checkpointing filesystem:
  the interface further comprising means for selecting sectors that are marked as free in the FAT and not marked for deletion in DFAT, for writing the user data to the selected sectors on the disk; for updating the FAT to reflect written user data, and for updating WFAT.

23. The checkpointing filesystem of a distributed-memory parallel supercomputer according to claim 20, further comprising deleting user data from the checkpointing filesystem:
  the interface further comprising means for deleting sectors associated with the user data to be deleted from the disk from the FAT, for determining whether the sectors to be deleted are marked in the WFAT, and for updating the DFAT if the sectors are not marked in WFAT.

24. The checkpointing filesystem of a distributed-memory parallel supercomputer according to claim 20, wherein the WFAT and the DFAT are accessible in random order.

25. The checkpointing filesystem of a distributed-memory parallel supercomputer according to claim 20, wherein a written or deleted list (WDLIST) is provided for maintaining information associated with the WFAT and the DFAT and is accessible in a sequential order.

* * * * *